United States Patent
Yoo et al.

(10) Patent No.: US 8,012,298 B2
(45) Date of Patent: Sep. 6, 2011

(54) MANUFACTURING METHOD FOR ORGANIC LIGHT EMITTING DISPLAY

(75) Inventors: Choongkeun Yoo, Incheon (KR); Minki Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 292 days.

(21) Appl. No.: 12/314,915

(22) Filed: Dec. 18, 2008

(65) Prior Publication Data

US 2009/0194220 A1  Aug. 6, 2009

(30) Foreign Application Priority Data

Dec. 31, 2007 (KR) .................. 10-2007-0141351

(51) Int. Cl.
- B29C 65/02 (2006.01)
- B29C 65/14 (2006.01)
- B32B 37/10 (2006.01)
- B32B 37/14 (2006.01)
- B32B 37/30 (2006.01)
- H01L 21/00 (2006.01)
- B29C 65/18 (2006.01)
- B32B 37/08 (2006.01)

(52) U.S. Cl. ............... 156/272.8; 156/272.2; 156/273.7; 156/285; 438/99; 438/158; 257/E21.024

(58) Field of Classification Search .............. 156/272.2, 156/272.8, 273.7, 285; 438/99, 159, 950; 257/E21.024

See application file for complete search history.

(56) References Cited

U.S. PATENT DOCUMENTS

| | | | |
|---|---|---|---|
| 6,284,307 B1 * | 9/2001 | Fukuzawa et al. | 427/66 |
| 7,199,516 B2 * | 4/2007 | Seo et al. | 313/504 |
| 7,291,970 B2 * | 11/2007 | Kuwabara | 313/504 |
| 7,923,284 B2 * | 4/2011 | Lee et al. | 438/99 |
| 2007/0122923 A1 * | 5/2007 | Kho et al. | 438/21 |

FOREIGN PATENT DOCUMENTS

| | | | |
|---|---|---|---|
| EP | 1752306 A1 * | 2/2007 | |
| GB | 2459908 B * | 3/2011 | |
| KR | 20070107527 A * | 11/2007 | |

OTHER PUBLICATIONS

Search Report for Application GB0820443.0—Mar. 9, 2009.*
Search Report for GB2459908B; Mar. 9, 2009.*

* cited by examiner

*Primary Examiner* — Sonya Mazumdar
(74) *Attorney, Agent, or Firm* — Morgan, Lewis & Bockius LLP

(57) ABSTRACT

A manufacturing method for an organic light emitting display includes forming a first electrode on a target substrate and forming a bank layer including an aperture region that exposes the first electrode; bonding the target substrate and a medium substrate oppositely spaced apart from a top portion of the target substrate and having an organic material layer, an absorption layer, a reflective layer, and a donor substrate sequentially arranged thereon; transferring an organic material layer onto the first electrode exposed in the bank layer by irradiating a laser onto the medium substrate to form an organic light emitting layer; and separating the target substrate and the medium substrate from each other and forming a second electrode on the organic light emitting layer formed on the target substrate, wherein the reflectivity of the absorption layer is lower than the reflectivity of the reflective layer.

11 Claims, 6 Drawing Sheets

Fig. 4

| A | R | A | R |
| A | R | A | R |
| A | R | A | R |
| A | R | A | R |
| A | R | A | R |

| A | R | A | R |
|---|---|---|---|
| R | A | R | A |
| R | A | R | | 
| A | R | A | R |
| R | A | R | A |

MANUFACTURING METHOD FOR ORGANIC LIGHT EMITTING DISPLAY

This application claims the benefit of Korean Patent Application No. 10-2007-0141351 filed on Dec. 31, 2007 which is hereby incorporated by reference.

BACKGROUND OF THE INVENTION

1. Field of the Invention

This document relates to a manufacturing method for an organic light emitting display.

2. Discussion of the Related Art

An organic light emitting device used for an organic light emitting display is a self-emitting device including a light emitting layer between two electrodes positioned on a substrate.

Organic light emitting displays are classified into a top-emission type, a bottom-emission type, and a dual-emission type according to a direction of emitting light. The organic light emitting displays are also classified into a passive matrix type and an active matrix type according to the driving method thereof.

In these organic light emitting displays, when scan signals, data signals, and power are supplied to a plurality of subpixels arranged in a matrix, selected subpixels emit light to thus display images.

In forming an organic light emitting layer in a manufacturing process of an organic light emitting display, there has been widely used a method of aligning a shadow mask and a target substrate in a vacuum chamber and depositing an organic material in an aperture region positioned on the target substrate.

However, the aforementioned method has many difficulties in manufacturing a shadow mask, such as the formation of an aperture region considering the sagging of the mask and the pitch adjustment of the mask, and is considered as being inappropriate for manufacturing a large-scale panel. Along with these problems, the deposition method using a mask brings about defects, such as scratches and deposition voids, caused by the mask upon depositing an organic light emitting layer. Thus, there is an urgent need for a technique that can substitute this method.

SUMMARY OF THE INVENTION

An aspect of this document is to provide a manufacturing method for an organic light emitting display, comprising: forming a first electrode on a target substrate and forming a bank layer including an aperture region that exposes the first electrode; bonding the target substrate and a medium substrate being oppositely spaced apart from the top portion of the target substrate and having an organic material layer, an absorption layer, a reflective layer, and a donor substrate sequentially arranged thereon; transferring an organic material layer onto the first electrode exposed in the bank layer by irradiating a laser onto the medium substrate to thus form an organic light emitting layer; and separating the target substrate and the medium substrate from each other and forming a second electrode on the organic light emitting layer formed on the target substrate, wherein the reflectivity of the absorption layer is lower than the reflectivity of the reflective layer.

BRIEF DESCRIPTION OF THE DRAWINGS

The accompanying drawings, which are included to provide a further understanding of the disclosure and are incorporated on and constitute a part of this specification illustrate embodiments of the disclosure and together with the description serve to explain the principles of the disclosure.

FIGS. 4 to 6 are illustrative views of the arrangement of an absorption layer and a reflective layer;

DETAILED DESCRIPTION OF PREFERRED EMBODIMENTS

Reference will now be made in detail to preferred embodiments of the invention examples of which are illustrated in the accompanying drawings.

Hereinafter, a concrete example according to an embodiment of the present disclosure will be described with reference to the attached drawings.

Figure 1:
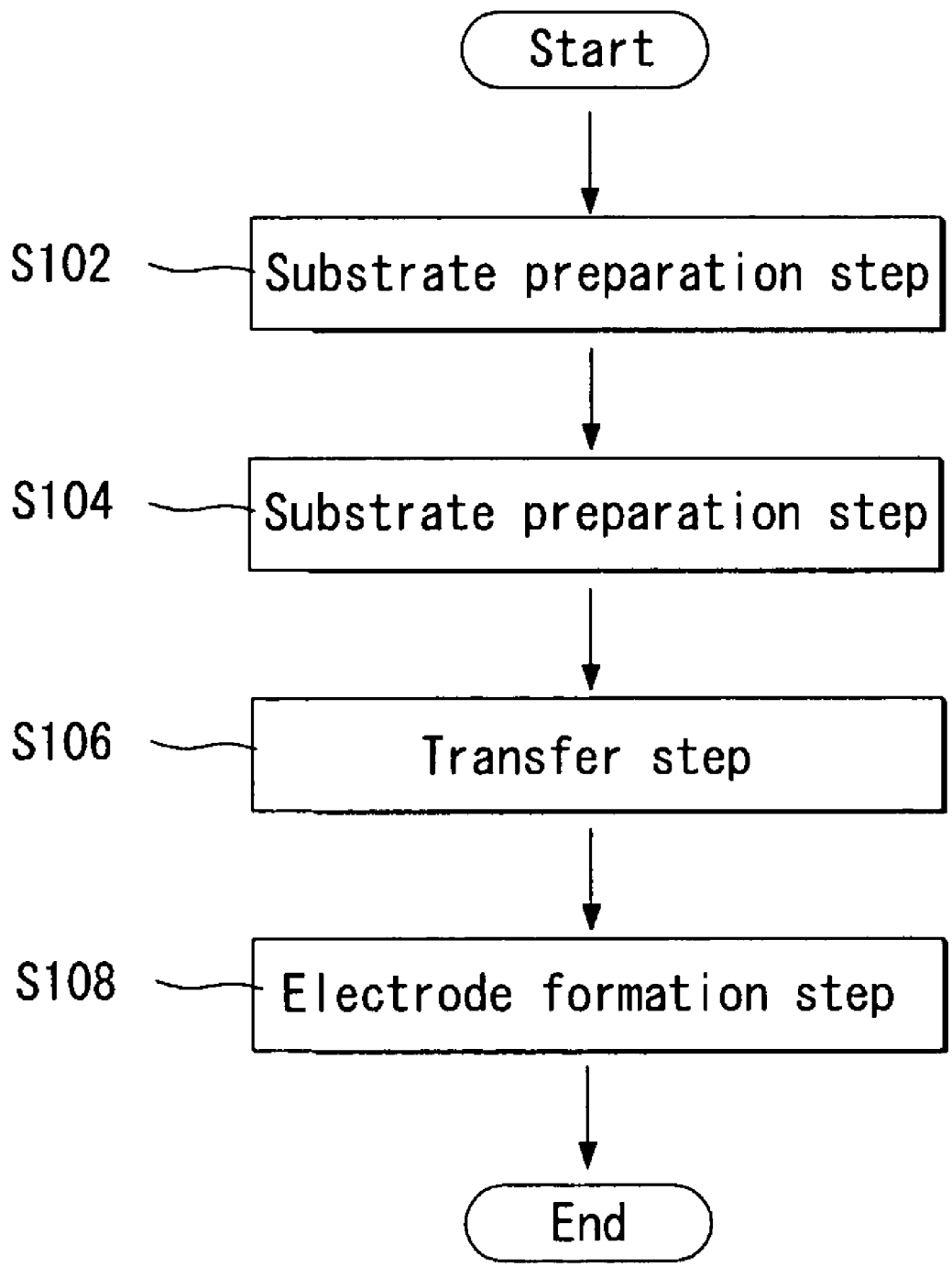
FIG. 1 is a schematic flow chart of a manufacturing method for an organic light emitting display according to one embodiment of the present disclosure.

As shown in FIG. 1, a manufacturing method for an organic light emitting display according to one embodiment of the present disclosure comprises a substrate preparation step S102, a transfer preparation step S104, a transfer step S106, and an electrode formation step S108.

First, the substrate preparation step S102 is a step of forming a first electrode on a target substrate and forming a bank layer including an aperture region that exposes the first electrode.

Here, the target substrate may include a passive matrix type organic light emitting display and an active matrix type organic light emitting display. In the present disclosure, the target substrate will be described in more detail with reference to FIG. 2 by way of an example in which the target substrate is an active matrix type organic light emitting display.

Figure 2:
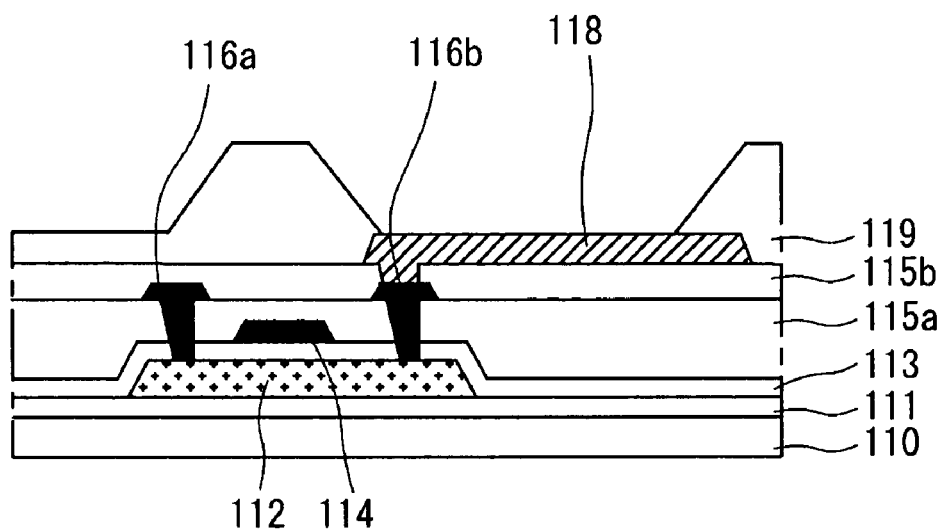
FIG. 2 is an illustrative view of a target substrate.

As shown in FIG. 2, in the case that the target substrate 110 is an active matrix type, the target substrate 110 further comprises a transistor unit positioned below the first electrode 118, and the first electrode 118 may be connected to a source 116a or drain 116b of a transistor included in the transistor unit.

The above-explained transistor unit may comprise a buffer layer 111 positioned on the target substrate 110. Further, the transistor unit may comprise a semiconductor layer 112 positioned on the buffer layer 111. Further, the transistor unit may comprise a first insulation film 113 positioned on the semiconductor layer 112. Further, the transistor unit may comprise a gate 114 positioned on the first insulation film 113. Further, the transistor unit may comprise a second insulation film 115a positioned on the first insulation film 113 and the gate 114. Further, the transistor unit may comprise a source 116a and a drain 116b which are connected to the semiconductor layer 112 via a contact hole. Further, the transistor unit may comprise a planarization film 115b positioned on the source 116a and drain 116b. Further, the transistor unit may comprise a first electrode 118 positioned on the planarization film 115b and connected to the source 116a and drain 116b via a contact hole. Further, the transistor unit may comprise a bank layer 119 positioned on the first electrode 118 and including an aperture region that exposes the first electrode 118.

Examples of the material for the target substrate 110 may include a glass plate, a metal plate, a ceramic plate, a plastic plate (e.g. polycarbonate resin, acrylic resin, vinyl chloride resin, polyethylene terephthalate resin, polyimide resin, polyester resin, epoxy resin, silicone resin, and fluorine resin), but are not limited thereto.

The buffer layer 111 protects a transistor formed in a following process from impurities, such as alkali ions leaked from the substrate 110, and is selectively formed of silicon oxide ($SiO_2$), silicon nitride ($SiN_x$) and so on.

The semiconductor layer 112 may include a source region and a drain region including p-type or n-type impurities. The semiconductor layer 112 may include a channel region in addition to the source region and the drain region.

The first insulation film 113 may be a silicon nitride film, a silicon oxide film, or a multilayer thereof, but is not limited thereto.

The gate 114 may be formed of any one selected from the group consisting of molybdenum (Mo), aluminum (Al), chromium (Cr), gold (Au), titanium (Ti), nickel (Ni), neodymium (Nd) and copper (Cu), or an alloy thereof, but is not limited thereto. The gate 114 may be a multilayer formed of Mo, Al, Cr, Au, Ti, Ni, Nd, or Cu, or an alloy thereof. The gate 114 may be a double layer including Mo/Al—Nd or Mo/Al, but is not limited thereto.

The source 116a and the drain 116b may be formed of a single layer or a multilayer. When the source 116a and the drain 116b are a single layer, the source 116a and the drain 116b may be formed of any one selected from the group consisting of molybdenum (Mo), aluminum (Al), chromium (Cr), gold (Au), titanium (Ti), nickel (Ni), neodymium (Nd) and copper (Cu), or an alloy thereof. When the source 116a and the drain 116b are a multilayer, the source 116a and the drain 116b may be formed of a double layer including Mo/Al—Nd or a triple layer including Mo/Al/Mo or Mo/Al—Nd/Mo. A data line, a capacitor upper electrode, and a power supply line may be positioned on the same layer as the source 116a and the drain 116b.

The second insulation film 115a may be formed of an inorganic material, such as silicon oxide or silicon nitride, by an SOG (silicate on glass) method, but is not limited thereto.

The planarization film 115b may be formed using a spin coating method by coating an organic material such as polyimide, benzocyclobutene-based resin and acrylate in the liquid form and then hardening it, but is not limited thereto. Either the second insulation film 115a or the planarization film 115b may be omitted.

The first electrode 118 may be an anode, a transparent electrode, or a reflective electrode. In case that the organic light emitting display has a bottom emission or dual emission structure, the first electrode 118 may be a transparent electrode, and may be formed of one of indium-tin-oxide (ITO), indium-zinc-oxide (IZO), and zinc oxide (ZnO). In case that the organic light emitting display has a top emission structure, the first electrode 118 may be a reflective layer, and may further comprise a reflective layer formed of one of Al, Ag or Ni under the layer formed of one of ITO, IZO, and ZnO. Further, the first electrode 118 may comprise a reflective layer positioned between two layers formed of one of ITO, IZO and ZnO.

Next, the transfer preparation step S104 is a step of bonding the target substrate and a medium substrate being oppositely spaced apart from the top portion of the target substrate and having an organic material layer, an absorption layer, a reflective layer, and a donor substrate sequentially arranged thereon.

When bonding the target substrate and the medium substrate, the target substrate and the medium substrate may be vacuum-bonded together. Hereinafter, the medium substrate will be described in more detail with reference to FIG. 3.

Figure 3:
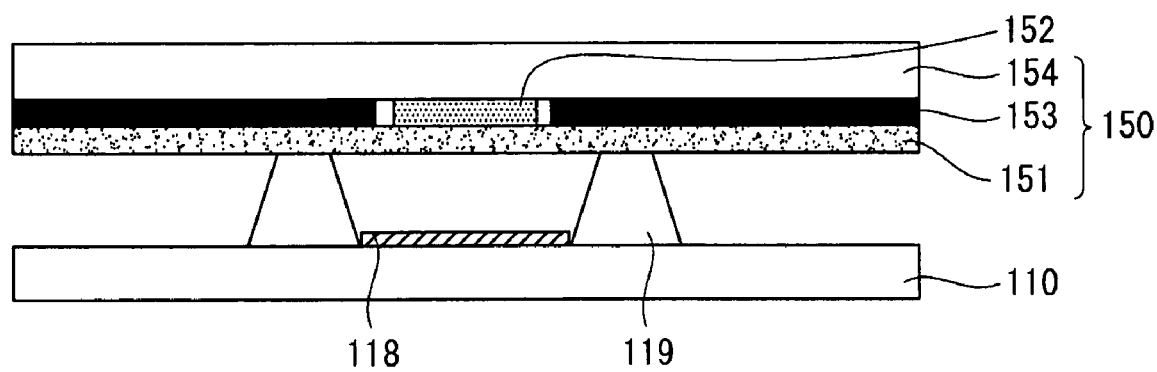
FIG. 3 is a schematic illustrative view of a target substrate and a medium substrate.

As shown in FIG. 3, the first electrode 118 and the bank layer 119 having an aperture region may be positioned on the target substrate 110 by the preceding process (a detailed drawing of the transistor unit or the like is omitted).

The medium substrate 150 may be oppositely spaced apart from the top portion of the target substrate 110 and have an aorganic material layer 151, an absorption layer 152, a reflective layer 153, and a donor substrate 154 sequentially arranged thereon.

The reflectivity of the absorption layer 152 may be lower than the reflectivity of the reflective layer 153. Due to this, a laser irradiated to the absorption layer 152 can reach the organic material layer 151, and a laser irradiated to the reflective layer 153 can be reflected or blocked without reaching the organic material layer 151. As a material of the absorption layer 152, Mo, W, Cr, and the like having low reflectivity can be selected, but not limited thereto. As a material of the reflective layer 153, Ag, Al, and the like having high reflectivity can be selected, but not limited thereto.

The size of the absorption layer 152 may be equal to or smaller than the size of the aperture region formed by the bank layer 119. That is, the absorption layer 152 may be formed in a size corresponding to a light emitting region of one subpixel.

The absorption layer 152 and the reflective layer 153 may be positioned on the same layer. The absorption layer 152 and the reflective layer 153 may be overlapped with each other or spaced apart from each other. In the case that the absorption layer 152 and the reflective layer 153 are spaced apart from each other, a gap between the absorption layer 152 and the reflective layer 153 may be 1~30 μm.

The size of the organic material layer 151 may correspond to the size of the donor substrate 154, but is not limited thereto and may be positioned in a bar type.

Here, the organic material layer 151 may be formed of an organic material of a different color for each donor substrate 154, and the organic material may be one that emits red, blue and green light. Therefore, the target substrate may have red, blue, and green light transferred thereto for each process.

The absorption layer 152 and the reflective layer 153 may be positioned in plural form in rows and columns of the donor substrate 154, and the absorption layer 152 and the reflective layer 153 may be positioned on the donor substrate 154 in the following manner.

Figures 4, 5:
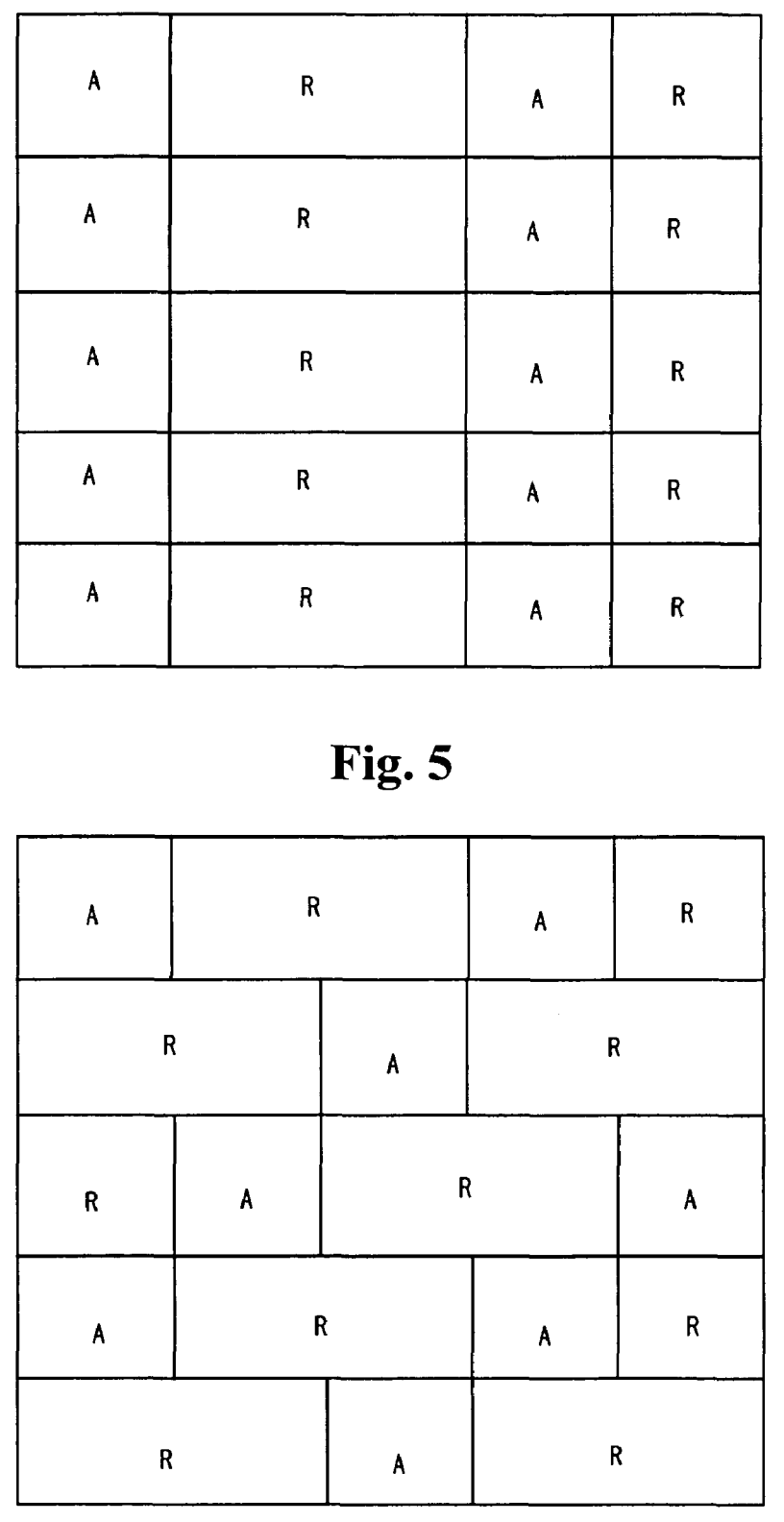

As shown in FIG. 4, a pattern "A" where the absorption layer is positioned and a pattern "R" where the reflective layer is positioned may be disposed on the donor substrate. The absorption layer (A) may be positioned the N-th row of the donor substrate, and the reflective layer (R) may be positioned in the N+1-th and N+2th rows thereof.

Once the absorption layer (A) and the reflective layer (R) are positioned in such a manner, an organic light emitting layer may be formed on the target substrate through a transfer step in a manner as shown in the following Table 1. It is assumed that the absorption layer (A) shown in FIG. 4 is formed by transferring a red organic material.

TABLE 1

| R | G | B | R | G |
|---|---|---|---|---|
| R | G | B | R | G |
| R | G | B | R | G |
| R | G | B | R | G |
| R | G | B | R | G |

As shown in FIG. 5, a pattern "A" where the absorption layer is positioned and a pattern "R" where the reflective layer is positioned may be disposed on the donor substrate. The absorption layer (A) may be positioned the N-th row of the donor substrate, and the reflective layer (R) may be positioned in the N+1-th and N+2th rows thereof. However, the absorption layer and the reflective layer may be positioned so as to move one or two rows to the left for each column of the donor substrate.

Once the absorption layer (A) and the reflective layer (R) are positioned in such a manner, an organic light emitting layer may be formed on the target substrate through a transfer step in a manner as shown in the following Table 2. It is assumed that the absorption layer (A) shown in FIG. 5 is formed by transferring a red organic material.

TABLE 2

| R | G | B | R | G |
|---|---|---|---|---|
| G | B | R | G | B |
| B | R | G | B | R |
| R | G | B | R | G |
| G | B | R | G | B |

Figure 6:
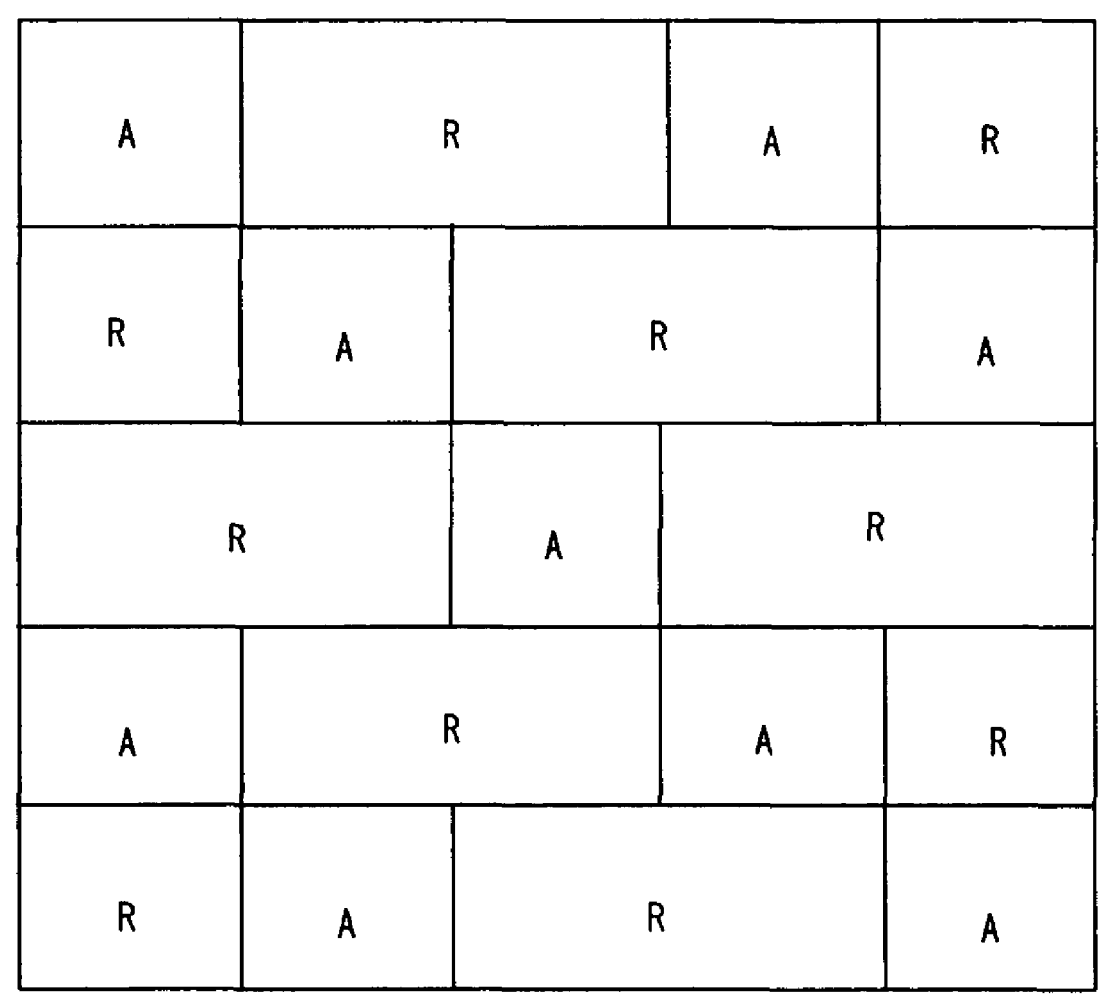

As shown in FIG. 6, a pattern "A" where the absorption layer is positioned and a pattern "R" where the reflective layer is positioned may be disposed on the donor substrate. The absorption layer (A) may be positioned the N-th row of the donor substrate, and the reflective layer (R) may be positioned in the N+1-th and N+2th rows thereof. However, the absorption layer and the reflective layer may be positioned so as to move one or two rows to the left for each column of the donor substrate.

Once the absorption layer (A) and the reflective layer (R) are positioned in such a manner, an organic light emitting layer may be formed on the target substrate through a transfer step in a manner as shown in the following Table 3. It is assumed that the absorption layer (A) shown in FIG. 6 is formed by transferring a red organic material.

TABLE 3

| R | G | B | R | G |
|---|---|---|---|---|
| B | R | G | B | R |
| G | B | R | G | B |
| R | G | B | R | G |
| B | R | G | B | R |

Next, the transfer step S106 is a step of transferring an organic material layer onto the first electrode exposed in the bank layer by irradiating a laser onto the medium substrate to thus form an organic light emitting layer.

Figure 7:
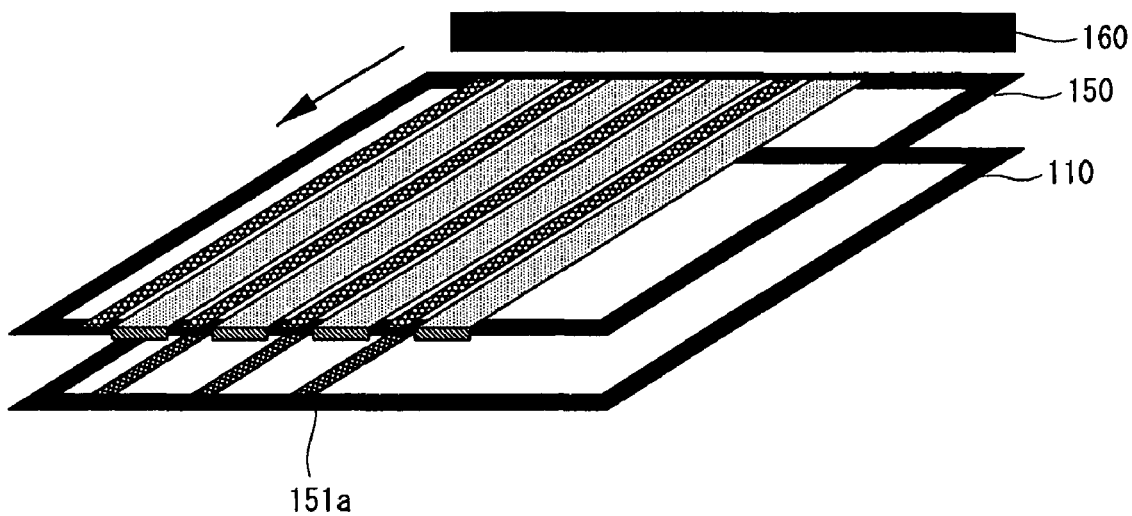
FIG. 7 is an illustrative view of a laser irradiation method.

As shown in FIG. 7, when a laser 160 is irradiated onto the medium substrate 150, an organic material 151a from an organic material layer can be transferred onto the first electrode exposed in the aperture region positioned on the target substrate 110. The laser 160 can use a line beam for scanning the entire bonded target substrate 110 and medium substrate 150 for each line and irradiating a laser. The laser 160 can be irradiated once or several times more.

Figure 8:
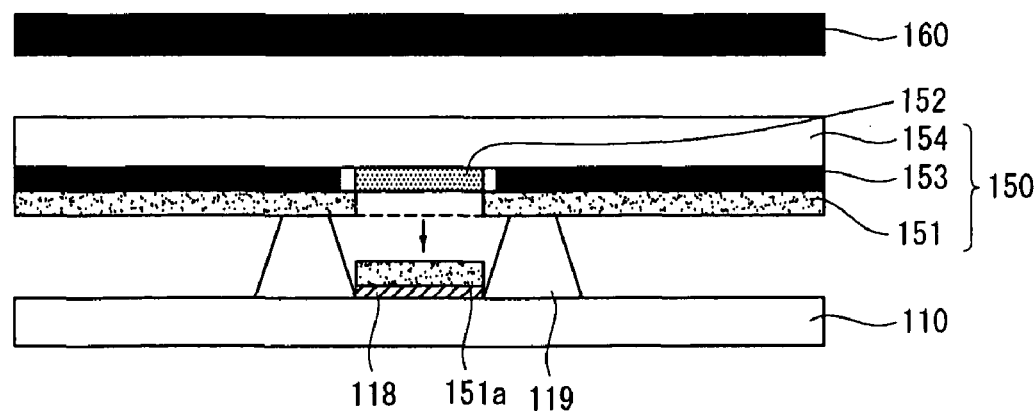
FIG. 8 is a schematic arrangement view of a target substrate, a medium substrate, and a laser.

The arrangement of the target substrate 110, the medium substrate 150, and the laser 160 may be as shown in FIG. 8. In this state, when the laser 160 is irradiated as if it scanned, the organic material layer 151 positioned in the region where the absorption layer 152 is positioned may be transferred into the aperture region formed by the bank layer 119 positioned on the target substrate 110. Accordingly, an organic light emitting layer 151a transferred from the organic material layer 151 can be formed on the first electrode 118.

The target substrate may include a passive matrix type organic light emitting display and an active matrix type light emitting display. However, the present disclosure is described by way of an example in which the target substrate is an active matrix type organic light emitting display, so the target substrate will be described briefly with reference to FIG. 9 following the structure described in FIG. 2.

Figure 9:
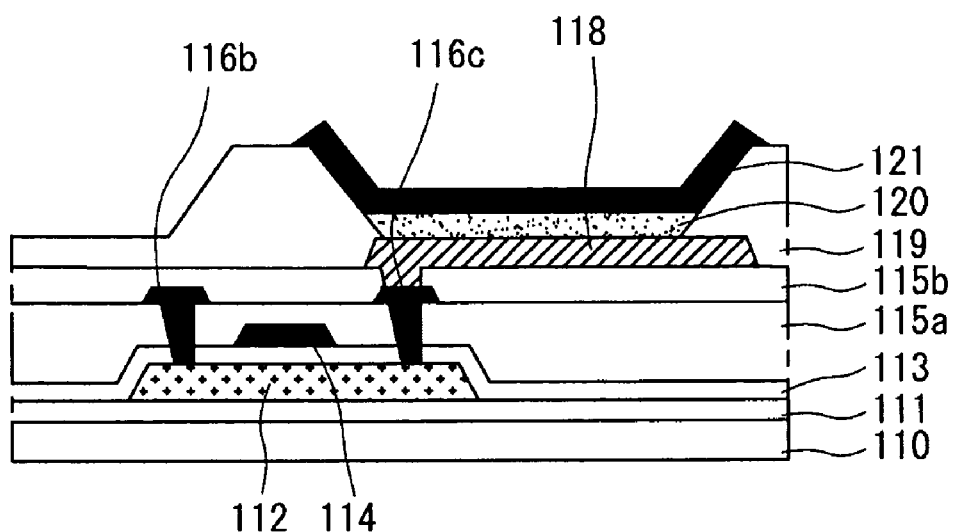
FIG. 9 is an illustrative view of a target substrate with an organic light emitting layer formed thereon.

As shown in FIG. 9, when a laser irradiates the medium substrate and the target substrate in the transfer step S106, an organic light emitting layer 120 may be formed on the first electrode 118.

Next, the electrode formation step S108 is a step of separating the target substrate and the medium substrate from each other and forming a second electrode on the organic light emitting layer formed on the target substrate.

Referring to the above-described FIG. 9, a second electrode 121 may be formed on the organic light emitting layer 120 in the electrode formation step S108.

In the above description, the first electrode 118, the organic light emitting layer 120, and the second electrode 121 are organic light emitting diodes included in the subpixels. The organic light emitting diodes may be formed in the following hierarchical structure.

Figure 10:
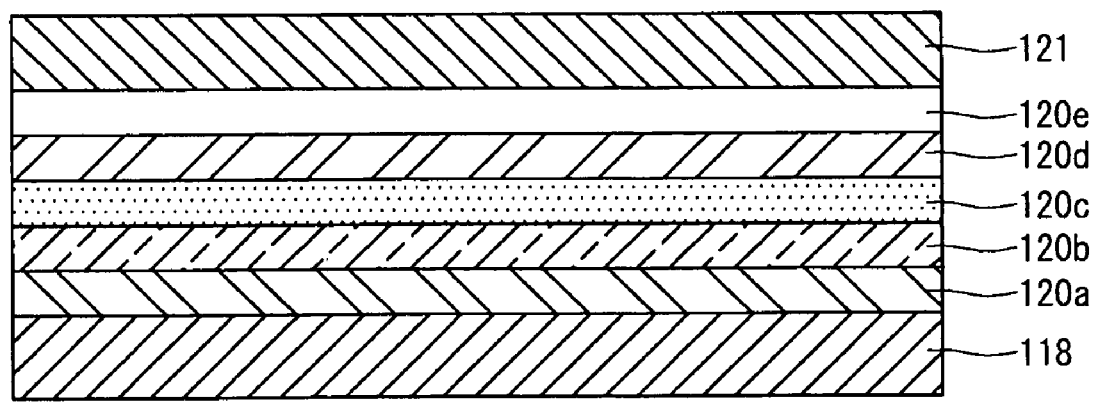
FIG. 10 is a hierarchical structure diagram of an organic light emitting diode.

As shown in FIG. 10, the organic light emitting diodes may include the first electrode 118, the organic light emitting layer 120, and the second electrode 121. The organic light emitting layer 120 may include a hole injection layer 120a, a hole transport layer 120b, a light emitting layer 120c, an electron transport layer 120d, and an electron injection layer 120e.

First, the hole injection layer 120a may be positioned on the first electrode 118. The hole injection layer 120a may function to facilitate the injection of holes from the first electrode 118 to the light emitting layer 120c. The hole injection layer 120a may be formed of at least one selected from the group consisting of copper phthalocyanine (CuPc), PEDOT(poly(3,4)-ethylenedioxythiophene), polyaniline (PANI) and NPD(N,N-dinaphthyl-N, N'-diphenyl benzidine), but is not limited thereto.

The hole injection layer 120a may be formed using an evaporation method or a spin coating method.

The hole transport layer 120b functions to smoothly transport holes. The hole transport layer 120b may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited thereto.

The hole transport layer 120b may be formed using an evaporation method or a spin coating method.

The light emitting layer 120c may be formed of a material capable of emitting red, green, blue and white light, for example, a phosphorescence material or a fluorescence material.

In case that the light emitting layer 120c produces red light, the light emitting layer 120c includes a host material including carbazole biphenyl (CBP) or mCP(1,2-bis (carbazol-9-yl). Further, the light emitting layer 120c may be formed of a phosphorescence material including a dopant material including at least one selected from the group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP (octaethylporphyrin platinum) or a fluorescence material including PBD:Eu(DBM)3(Phen) or Perylene, but is not limited thereto.

In case that the light emitting layer 120c produces green light, the light emitting layer 120c includes a host material including CBP or mCP. Further, the light emitting layer 120c may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case that the light emitting layer 120c produces blue light, the light emitting layer 120c includes a host material including CBP or mCP. Further, the light emitting layer 120c may be formed of a phosphorescence material including a dopant material including (4,6-F2 ppy)2Irpic.

Alternatively, the light emitting layer 120c may be formed of a fluorescence material including any one selected from the group consisting of spiro-DPVBi, spiro-6P, distyryl-benzene (DSB), distyryl-arylene (DSA), PFO-based polymers, PPV-based polymers and a combination thereof, but is not limited thereto.

The electron transport layer 120d functions to facilitate the transportation of electrons. The electron transport layer 120d may be formed of at least one selected from the group consisting of Alq3(tris(8-hydroxyquinolino)aluminum, PBD, TAZ, spiro-PBD, BAlq, and SAlq, but is not limited thereto.

The electron transport layer 120d may be formed using an evaporation method or a spin coating method.

The electron transport layer 120d can also function to prevent holes, which are injected from the first electrode 118 and then pass through the light emitting layer 120c, from moving to the second electrode 121. In other words, the electron transport layer 120d serves as a hole stop layer, which facilitates the coupling of holes and electrons in the light emitting layer 120c.

The electron injection layer 120e functions to facilitate the injection of electrons. The electron injection layer 120e may be formed of Alq3(tris(8-hydroxyquinolino)aluminum), PBD, TAZ, spiro-PBD, BAlq or SAlq, but is not limited thereto.

The electron injection layer 120e may be formed of an organic material and an inorganic material forming the electron injection layer through a vacuum evaporation method.

The hole injection layer 120a or the electron injection layer 120e may further include an inorganic material. The inorganic material may further include a metal compound. The metal compound may include alkali metal or alkaline earth metal. The metal compound including the alkali metal or the alkaline earth metal may include at least one selected from the group consisting of LiQ, LiF, NaF, KF, RbF, CsF, FrF, BeF2, MgF2, CaF2, SrF2, BaF2, and RaF2, but is not limited thereto. Thus, the inorganic material inside the electron injection layer 174 facilitates hopping of electrons injected from the second electrode 121 to the light emitting layer 120c, so that holes and electrons injected into the light emitting layer 120c are balanced. Accordingly, the light emission efficiency can be improved.

Further, the inorganic material inside the hole injection layer 120a reduces the mobility of holes injected from the first electrode 118 to the light emitting layer 120c, so that holes and electrons injected into the light emitting layer 120c are balanced. Accordingly, the light emission efficiency can be improved.

The present disclosure is not limited to FIG. 7, and at least one of the electron injection layer 120e, the electron transport layer 120d, the hole transport layer 120b, and the hole injection layer 120a may be omitted.

As described above, the embodiment of the present disclosure can provide an organic light emitting display which makes it easy to manufacture a large-scale panel and reduces process time to thus improve production yield.

The foregoing embodiments and advantages are merely exemplary and are not to be construed as limiting the present disclosure. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A manufacturing method for an organic light emitting display, comprising:
   forming a first electrode on a target substrate and forming a bank layer including an aperture region that exposes the first electrode;
   bonding the target substrate and a medium substrate oppositely spaced apart from a top portion of the target substrate and having an organic material layer, an absorption layer, a reflective layer, and a donor substrate sequentially arranged thereon;
   transferring the organic material layer onto the first electrode exposed in the bank layer by irradiating a laser onto the medium substrate to form an organic light emitting layer; and
   separating the target substrate and the medium substrate from each other and forming a second electrode on the organic light emitting layer formed on the target substrate,
   wherein the reflectivity of the absorption layer is lower than the reflectivity of the reflective layer.

2. The method of claim 1, wherein the size of the absorption layer is equal to or smaller than the size of the aperture region.

3. The method of claim 1, wherein the absorption layer and the reflective layer are positioned on the same layer.

4. The method of claim 1, wherein the absorption layer and the reflective layer are overlapped with each other or spaced apart from each other.

5. The method of claim 4, wherein the absorption layer and the reflective layer are spaced apart from each other, and a gap between the absorption layer and the reflective layer is about 1~30 μm.

6. The method of claim 1, wherein the size of the organic material layer corresponds to the size of the donor substrate.

7. The method of claim 1, wherein the absorption layer and the reflective layer are positioned in plural form in rows and columns of the donor substrate, and
   the absorption layer is positioned the N-th row of the donor substrate, and the reflective layer is positioned in the N+1-th and N+2th rows thereof.

8. The method of claim 1, wherein the absorption layer and the reflective layer are positioned so as to move one or two rows to the left for each column of the donor substrate.

9. The method of claim 1, wherein the organic material layer is formed of an organic material of a different color for each donor substrate.

10. The method of claim 1, wherein the target substrate includes a transistor unit positioned below the first electrode, and the first electrode is connected to a source or drain of a transistor included in the transistor unit.

11. The method of claim 1, wherein the bonding of the target substrate and the medium substrate includes vacuum-bonding the target substrate and the medium substrate area together.

* * * * *